(12) United States Patent
Ella et al.

(10) Patent No.: US 7,786,819 B2
(45) Date of Patent: Aug. 31, 2010

(54) APPARATUS COMPRISING AN ANTENNA ELEMENT, WHICH EFFICIENTLY PERFORMS AT BOTH A FIRST RESONANT FREQUENCY BAND AND A SECOND RESONANT FREQUENCY BAND, METHOD AND COMPUTER PROGRAM THEREFORE

(75) Inventors: Juha S. Ella, Halikko (FI); Janne P. Kylakoski, Paimio (FI)

(73) Assignee: Nokia Corporation, Espoo (FI)

( * ) Notice: Subject to any disclaimer, the term of this patent is extended or adjusted under 35 U.S.C. 154(b) by 94 days.

(21) Appl. No.: 11/897,614

(22) Filed: Aug. 31, 2007

(65) Prior Publication Data

US 2009/0058550 A1 Mar. 5, 2009

(51) Int. Cl.
*H03H 7/38* (2006.01)

(52) U.S. Cl. .................. 333/17.3; 333/32; 455/123; 455/248.1

(58) Field of Classification Search ................ 333/17.3, 333/32; 455/123, 125, 248.1; 343/860, 861, 343/745
See application file for complete search history.

(56) References Cited

U.S. PATENT DOCUMENTS

| | | | | |
|---|---|---|---|---|
| 5,589,844 | A | * | 12/1996 | Belcher et al. ............... 343/860 |
| 5,778,308 | A | | 7/1998 | Sroka et al. .................. 455/115 |
| 6,946,847 | B2 | * | 9/2005 | Nishimori et al. ........... 324/600 |
| 7,199,678 | B2 | * | 4/2007 | Matsuno ...................... 333/17.3 |
| 7,671,693 | B2 | * | 3/2010 | Brobston et al. ............ 333/17.3 |
| 2004/0263411 | A1 | | 12/2004 | Fabrega-Sanchez et al. . 343/861 |
| 2006/0151591 | A1 | | 7/2006 | Matsuno ................... 235/91 G |
| 2007/0069957 | A1 | | 3/2007 | Ranta .......................... 343/700 |
| 2007/0194859 | A1 | | 8/2007 | Brobston et al. ............ 333/17.3 |
| 2007/0197180 | A1 | * | 8/2007 | McKinzie et al. ......... 455/248.1 |

FOREIGN PATENT DOCUMENTS

WO    WO 2007/036774 A1    4/2007

* cited by examiner

*Primary Examiner*—Robert Pascal
*Assistant Examiner*—Kimberly E Glenn
(74) *Attorney, Agent, or Firm*—Harrington & Smith

(57) ABSTRACT

An apparatus including a matching circuit; a first variable reactance component, having a first range of reactance values, and connected to the matching circuit and connectable to an antenna element operable in a first frequency band and a second frequency band; a second variable reactance component, having a second range of reactance values, and connected to the matching circuit; a detector for detecting a parameter, indicative of the impedance of the apparatus, over at least a part of the first range and second range of reactance values; and a controller configured to determine, using information provided by the detector, optimum ratios of second reactance values to first reactance values, at a frequency in the first frequency band, and configured to select a first optimum ratio when the second frequency band is greater than the first frequency band and configured to select a second different optimum ratio when the second frequency band is less than the first frequency band.

21 Claims, 6 Drawing Sheets

APPARATUS COMPRISING AN ANTENNA ELEMENT, WHICH EFFICIENTLY PERFORMS AT BOTH A FIRST RESONANT FREQUENCY BAND AND A SECOND RESONANT FREQUENCY BAND, METHOD AND COMPUTER PROGRAM THEREFORE

FIELD OF THE INVENTION

Embodiments of the present invention relate to an apparatus, a method and a computer program. In particular, they relate to an apparatus, method and computer program in a portable radio telephone.

BACKGROUND TO THE INVENTION

Devices such as mobile cellular telephones usually have at least one antenna element by which they can communicate with other devices. If the context of the device changes, the impedance of the antenna element at a desired frequency band may also change. For example, if a user handles the device, the antenna element may electromagnetically couple with the user and the impedance of the antenna element at the desired frequency band may change as a consequence. Consequently, such a device may not be able to communicate efficiently (and may not be able to communicate at all) when the device changes context.

Furthermore, if the antenna element is operable in a first resonant frequency band and a second resonant frequency band, it may be difficult to compensate for the change in impedance of the antenna element so that the antenna element performs efficiently at both the first resonant frequency band and the second resonant frequency band.

Therefore, it would be desirable to provide an alternative device.

BRIEF DESCRIPTION OF THE INVENTION

According to various embodiments of the invention there is provided an apparatus comprising: a matching circuit; a first variable reactance component, having a first range of reactance values, and connected to the matching circuit and connectable to an antenna element operable in a first frequency band and a second frequency band; a second variable reactance component, having a second range of reactance values, and connected to the matching circuit; a detector for detecting a parameter, indicative of the impedance of the apparatus, over at least a part of the first range and second range of reactance values; and a controller configured to determine, using information provided by the detector, optimum ratios of second reactance values to first reactance values, at a frequency in the first frequency band, and configured to select a first optimum ratio when the second frequency band is greater than the first frequency band and configured to select a second different optimum ratio when the second frequency band is less than the first frequency band.

The apparatus may be for wireless communication.

The controller may be configured to determine if the second frequency band is higher or lower than the first frequency band. The detector may be configured to detect the parameter over at least a part of the first range and second range of reactance values at the frequency in the first frequency band.

The controller may be configured to change the reactance value of the first variable reactance component while keeping the reactance value of the second variable reactance component constant. The detector may be arranged to detect the parameter after each change in reactance value of the first variable reactance component. When the first variable reactance component has changed reactance value a predetermined number of times, the controller may be configured to change the reactance value of the second variable reactance component. The detector may be arranged to detect the parameter after the change in reactance value of the second variable reactance component.

The parameter of the apparatus may be the voltage standing wave ratio (VSWR) of the apparatus.

The detector may include a coupler and may be connected to the second variable reactance component.

The first variable reactance component may be a series capacitor. The second variable reactance component may be a shunt capacitor. The controller may be configured to determine two optimum ratios of second reactance values to first reactance values. The controller may be configured to select the numerically higher optimum ratio when the second frequency band is greater than the first frequency band. The controller may be configured to select the numerically lower optimum ratio when the second frequency band is less than the first frequency band.

According to various embodiments of the invention, there is provided a method comprising: detecting a parameter, indicative of the impedance of an apparatus, over at least a part of a first range of reactance values of a first variable reactance component, connected to a matching circuit and connectable to an antenna element operable in a first frequency band and a second frequency band, and over at least a part of a second range of reactance values of a second variable reactance component, connected to the matching circuit; determining, using information provided by the detection, optimum ratios of second reactance values to first reactance values, at a frequency in the first frequency band; selecting a first optimum ratio when the second frequency band is greater than the first frequency band; and selecting a second different optimum ratio when the second frequency band is less than the first frequency band.

The method may comprise determining if the second frequency band is higher or lower than the first frequency band. The detection may be performed at the frequency in the first frequency band.

The method may comprise changing the reactance value of the first variable reactance component while keeping the reactance value of the second variable reactance component constant. The method may comprise detecting the parameter after each change in reactance value of the first variable reactance component. The method may further comprise changing the reactance value of the second variable reactance component when the first variable reactance component has changed reactance value a predetermined number of times. The method may further comprise detecting the parameter after the change in reactance value of the second variable reactance component.

The parameter of the apparatus may be the voltage standing wave ratio (VSWR) of the apparatus.

The first variable reactance component may be a series capacitor. The second variable reactance component may be a shunt capacitor.

The determination may determine two optimum ratios. The method may comprise selecting the numerically higher optimum ratio when the second frequency band is greater than the first frequency band. The method may comprise selecting the numerically lower optimum ratio when the second frequency band is less than the first frequency band.

According to various embodiments of the invention, there is provided a computer program comprising program instructions for controlling a first variable reactance component and a second variable reactance component and comprising means for detecting a parameter, indicative of the impedance of an apparatus, over at least a part of a first range of reactance values of the first variable reactance component, connected to a matching circuit and connectable to an antenna element operable in a first frequency band and a second frequency band, and over at least a part of a second range of reactance values of the second variable reactance component, connected to the matching circuit; means for determining, using information provided by the detection, optimum ratios of second reactance values to first reactance values, at a frequency in the first frequency band; means for selecting a first optimum ratio when the second frequency band is greater than the first frequency band; and means for selecting a second different optimum ratio when the second frequency band is less than the first frequency band.

According to various embodiments of the invention, there is provided a physical entity embodying the computer program as described in the preceding paragraphs.

According to various embodiments of the invention, there is provided an electromagnetic carrier signal carrying the computer program as described in the preceding paragraphs.

According to various embodiments of the invention, there is provided a computer program comprising program instructions for causing a computer to perform the method as described in the preceding paragraphs.

According to various embodiments of the invention, there is provided a device comprising the apparatus as described in the preceding paragraphs. The device may be for wireless communication.

According to various embodiments of the invention, there is provided a module comprising the apparatus as described in the preceding paragraphs. The module may be for wireless communication.

BRIEF DESCRIPTION OF THE DRAWINGS

For a better understanding of the present invention reference will now be made by way of example only to the accompanying drawings in which.

DETAILED DESCRIPTION OF EMBODIMENTS OF THE INVENTION

Figure 1:
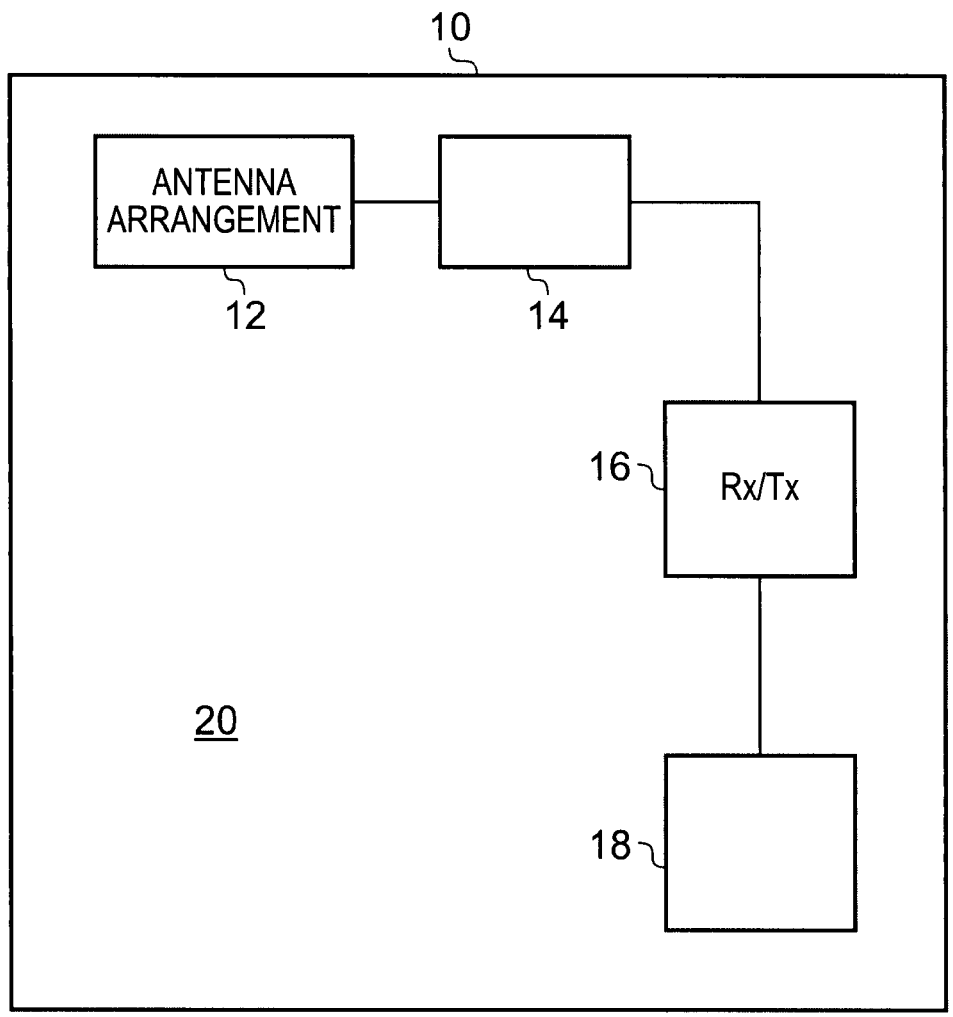
FIG. 1 illustrates a schematic diagram of a device according to one embodiment of the invention.

FIGS. 2, 4, 5, 6 and 7 illustrate an apparatus 14 comprising: a matching circuit 24; a first variable reactance component 22, having a first range of reactance values, and connected to the matching circuit 24 and connectable to an antenna element 34 operable in a first frequency band and a second frequency band; a second variable reactance component 26, having a second range of reactance values, and connected to the matching circuit 24; a detector 28 for detecting a parameter, indicative of the impedance of the apparatus, over at least a part of the first range and second range of reactance values; and a controller 30 configured to determine, using information provided by the detector 28, optimum ratios of second reactance values to first reactance values, at a frequency in the first frequency band, and configured to select a first optimum ratio when the second frequency band is greater than the first frequency band and configured to select a second different optimum ratio when the second frequency band is less than the first frequency band.

FIG. 1 illustrates a device 10 such as a portable radio device (for example, a mobile cellular telephone or a personal digital assistant), a cellular base station, other radio communication device or module for such devices.

The device 10 comprises an antenna arrangement 12, an apparatus 14, a transceiver 16 and functional circuitry 18. The antenna arrangement 12 includes at least one antenna element which is operable in two different resonant frequency bands. The apparatus 14 is connected to the antenna arrangement 12 and is also connected to the transceiver 16. The apparatus 14 is configured to adaptively tune the one or more antenna elements in the antenna arrangement 12. The functional circuitry 18 is connected to the transceiver 16 and is operable to provide signals to, and receive signals from the transceiver 16.

In the embodiment where the device 10 is a mobile cellular telephone, the functional circuitry 18 may include a processor, a memory and input/output devices such as a microphone, a loudspeaker and a display. The electronic components that provide the apparatus 14, the transceiver 16 and the functional circuitry 18 are interconnected via a printed wiring board (PWB) 20. In various embodiments the PWB 20 may be used as a ground plane for the antenna arrangement 12. In other embodiments, the antenna arrangement 12 may not have a ground plane.

Figure 2:
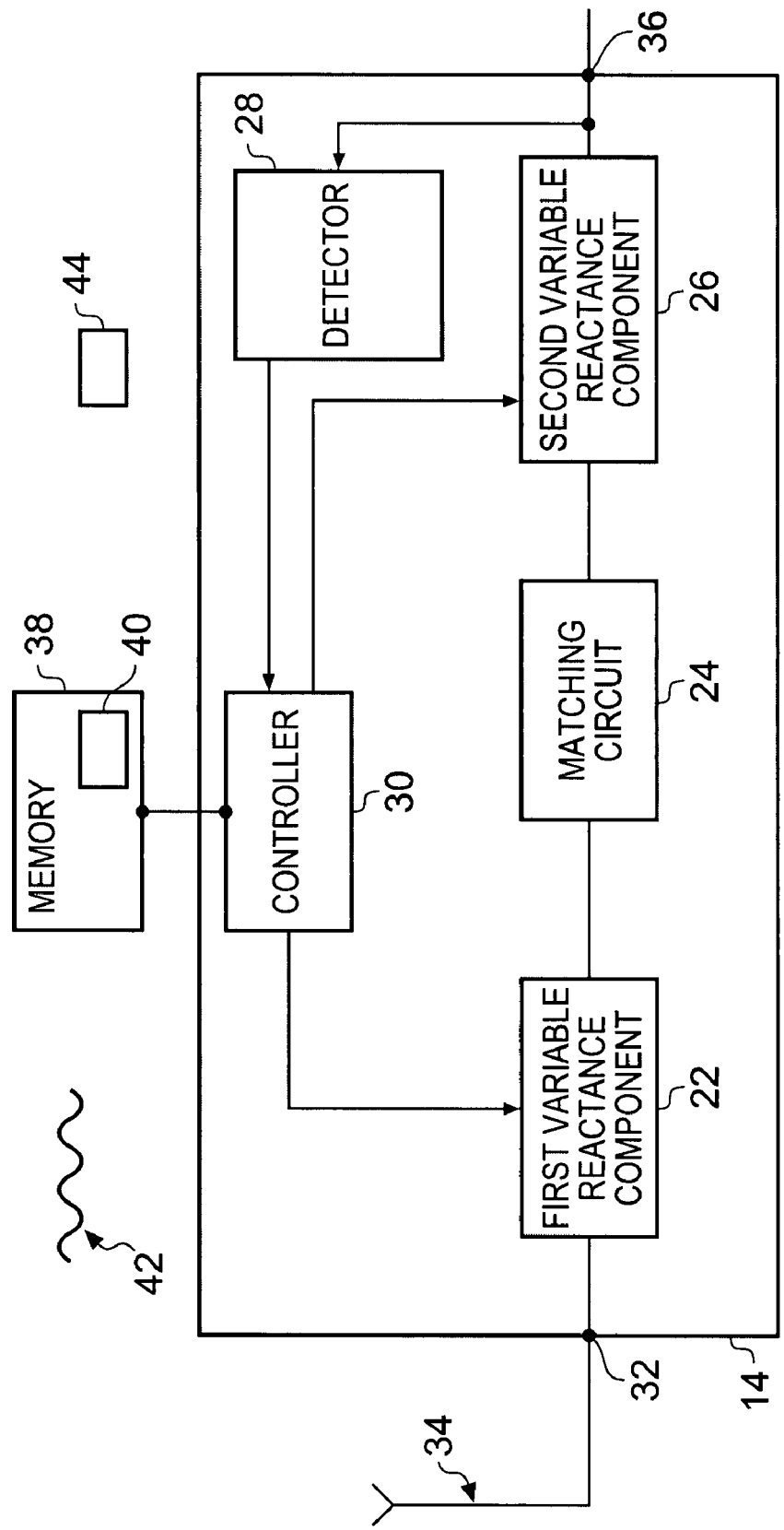
FIG. 2 illustrates a schematic diagram of an apparatus according to one embodiment of the invention.

FIG. 2 illustrates a schematic diagram of an apparatus 14 according to one embodiment of the invention. In more detail, the apparatus 14 includes a first variable reactance component 22, a matching circuit 24, a second variable reactance component 26, a detector 28 and a controller 30.

The first variable reactance component 22 is connected to the matching circuit 24 and to a first interface 32. The first interface 32 is connectable to an antenna element 34 operable in a first resonant frequency band and a second, different resonant frequency band. The first variable reactance component 22 has a range of reactance values and may be a variable capacitor or a variable inductor.

The second variable reactance component 26 is connected to the matching circuit 24, to the detector 28 and to a second interface 36. The second interface 36 is connectable to the transceiver 16. The second variable reactance component 26 has a range of reactance values and may be a variable capacitor or a variable inductor.

The matching circuit 24 is designed so that when the antenna element 34 is connected to the apparatus 14, the antenna element 34 is operable in two different resonant frequency bands. The antenna element 34 is a planar inverted L antenna (PILA). In other embodiments, the antenna element 34 may be any other suitable antenna element which has an impedance (when not connected to any device or apparatus) of more than or less than 50 Ohms at the desired resonant frequency bands (i.e. the antenna element is naturally non-resonating at the desired resonant frequency bands because its impedance at the desired resonant frequency bands is substantially greater than or less than 50 Ohms).

The antenna arrangement 12 may include additional antenna elements and may include any combination of planar inverted F antennas (PIFA's), inverted F antennas (IFA's), whip antennas, loop antennas, helix antennas, monopole antennas, slot antennas, notch antennas and dielectric resonator antennas (DRA's).

The antenna arrangement 12 may be arranged to operate in a plurality of different operational radio frequency bands and via a plurality of different protocols. In various embodiments, the antenna arrangement 12 includes a plurality of antenna elements which may operate according to different protocols (multiradio device) or the same protocol (diversity/MIMO). For example, the different frequency bands and protocols may include (but are not limited to) DVB-H 470 to 750 MHz, US-GSM 850 (824-894 MHz); EGSM 900 (880-960 MHz); GPS 1572.42 MHz, PCN/DCS1800 (1710-1880 MHz); US-WCDMA1900 (1850-1990) band; WCDMA2100 band (Tx: 1920-1980 Rx: 2110-2180); PCS1900 (1850-1990 MHz); 2.5 GHz WLAN/BT, 5 GHz WLAN, DRM (0.15-30.0 MHz), FM (76-108 MHz), AM (0.535-1.705 MHz), DVB-H [US] (1670-1675 MHz), WiMax (2300-2400 MHz, 2305-2360 MHz, 2496-2690 MHz, 3300-3400 MHz, 3400-3800 MHz, 5150-5875 MHz), RFID (LF [125-134 kHz], HF [13.56 MHz]) UHF [433 MHz, 865-956 MHz or 2.45 GHz), and UWB 3.0 to 10.6 GHz. The antenna element 34 may be operable in any of the above mentioned frequencies.

The detector 28 is connected to the second variable reactance component 26 to detect a parameter indicative of the impedance of the apparatus 14. The detector 28 is also connected to the controller 30 to provide the detection information to the controller 30.

The controller 30 may be a microprocessor or any other suitable circuitry. For example, the controller 30 may alternatively be a hardwired logic circuit. The controller 30 is connected to, and operable to control the first variable reactance component 22 and the second variable reactance component 26. The controller 30 is also connected to a memory 38. It should be appreciated that the controller 30 and the memory 38 may be part of the functional circuitry 18 or may be circuitry dedicated solely to the apparatus 14.

Figure 3:
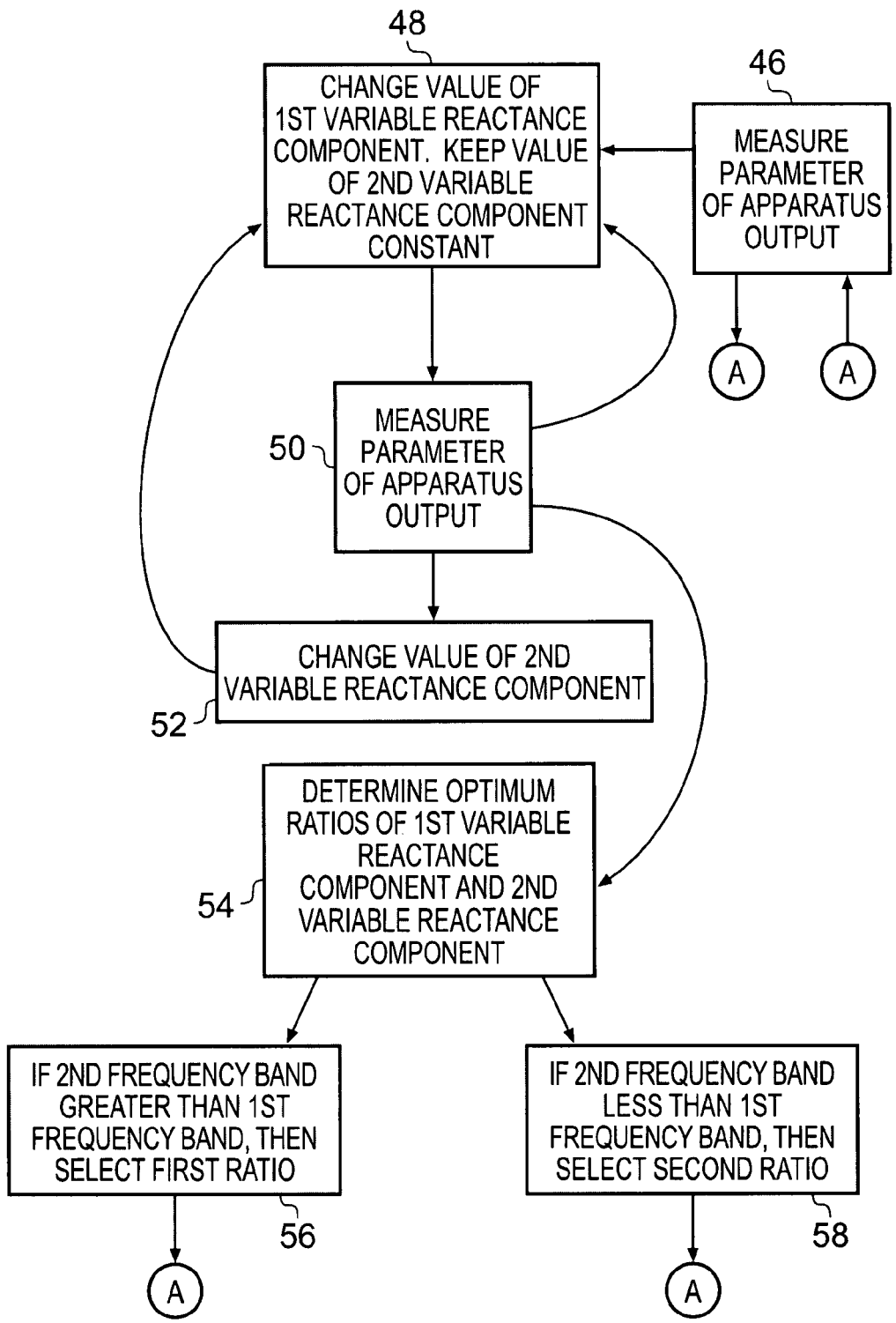
FIG. 3 illustrates a flow diagram of how reactance values of a first variable reactance component and a second variable reactance component are selected according to one embodiment of the invention.

The memory 38 stores computer program instructions 40, which when loaded into the controller 30, enable the controller 30 to control the operation of the apparatus 14 as described below. The computer program instructions 40 provide the logic and routines that enables the apparatus 14 to perform the method illustrated in FIG. 3.

The computer program instructions 40 may arrive at the device 10 via an electromagnetic carrier signal 42 or be copied from a physical entity 44 such as a computer program product, a memory device or a record medium such as a CD-ROM or DVD.

The apparatus 14 is configured to adaptively tune the antenna element 34 so that it efficiently resonates in two predetermined resonant frequency bands. The process carried out by the apparatus 14 will be described in the following paragraphs with reference to FIGS. 2 and 3. The blocks illustrated in FIG. 3 may represent steps in a method and/or sections of code in the computer program 40. The illustration of a particular order to the blocks does not necessarily imply that there is a required or preferred order for the blocks and the order and arrangement of the blocks may be varied.

Initially at step 46, the detector 28 detects a parameter of the apparatus 14 (indicative of the impedance of the apparatus 14) at a frequency in the first frequency band of the antenna element 34. If the detected parameter does not fulfill predetermined criteria, the process moves to step 48. If the detected parameter does fulfill the predetermined criteria, the process loops back to step 46. In other embodiments, the process may always move to step 48 from step 46 and there may be no determination of whether the detected parameter fulfils predetermined criteria.

In various embodiments, the parameter is the voltage standing wave ratio (VSWR) of the apparatus 14 as measured at the second interface 36. In one embodiment, if the detected VSWR exceeds a threshold value, the process moves to step 48 and if the detected VSWR is less than the threshold value, the process loops back to step 46.

In various embodiments, the first frequency band of the antenna element 34 is used by the device 10 for transmission and the second frequency band of the antenna element 34 is used for reception. For example, in WCDMA2100 the transmission band is 1920-1980 MHz and the reception band is 2110-2180 MHz. In this embodiment, the VSWR of the apparatus 14 is measured while transmitting at a frequency in the first frequency band.

At step 48, the controller 30 controls the first variable reactance component 22 to change reactance value and controls the second variable reactance component 26 to maintain a constant reactance value. The process then moves to step 50 and the parameter of the apparatus 14 is measured and stored in the memory 38. The process then loops back to step 48 and the above steps are repeated until the parameter of the apparatus 14 has been measured (and stored) at each reactance value in the first reactance range (or a desired portion of the first reactance range) at a constant reactance value of the second variable reactance component 26.

Subsequently at step 52, the controller 30 controls the second variable reactance component 26 to change reactance value within the second range of reactance values and the parameter of the apparatus 14 is measured and stored. The process then moves to step 48 and the process in the preceding paragraph is repeated for the new reactance value of the second variable reactance component. Once the parameter has been measured at the reactance values of the first variable reactance component 22 at the new reactance value of the second variable reactance component 26, the controller 30 controls the second variable reactance component 26 to change reactance value again and the process of changing the reactance value of the first variable reactance component 22 and measuring the parameter of the apparatus 14 is repeated.

Consequently, the controller 30 controls the first and second variable reactance components 22 and 26 so that the parameter can be measured across the whole, or a desired part, of the first and second reactance ranges. The above method produces a list of reactance values for the first and second variable reactance components 22, 26 and their corresponding measured parameter value. At step 54, the controller 30 analyses the measured parameter values and determines the pairs of optimum reactance values. Since the measured parameter is indicative of the impedance of the apparatus 14, the controller 30 selects the parameter values (and hence pairs of reactance values) which correspond to a desired impedance for the apparatus 14 (for example, 50 Ohms). The determination at step 54 produces two pairs of reactance values. The controller 30 then processes the pairs of reactance values into ratios of the second variable reactance component value to the first variable reactance component value (i.e. Component 26: Component 22).

At step 56, the controller 30 determines if the second frequency band is greater than the first frequency band. If this is true, the controller 30 selects a first ratio and controls the first and second variable reactance components 22, 26 to have the reactance values measured for that ratio.

At step 58, the controller 30 determines if the second frequency band is less than the first frequency band. If this is true, the controller 30 selects a second ratio (different to the first ratio) and controls the first and second variable reactance components to have the reactance values measured for that ratio.

The selection of an optimum ratio of reactance values is dependent upon (at least partially) the actual circuitry used in the apparatus 14. This will be explained in more detail in the following paragraphs with respect to FIGS. 4 to 7.

It should be appreciated that the determination of whether the second frequency band is greater than or less than the first frequency band may have alternatively been determined prior to the initialization of the method at step 46 (for example) or during another step of the method.

After steps 56 and 58, the process moves back to step 46 and is repeated.

Embodiments of the present invention provide an advantage in that they provide adaptive tuning of an antenna element. The apparatus 14 is configured to detect changes in impedance of an antenna element and then reactively compensate for the changes in impedance. This may result in the device operating more efficiently (since the electrical energy supplied to the antenna element will be maximized) and effectively (the signal strength of the antenna element may be improved).

Furthermore, embodiments of the present invention provide an advantage in that they are able to compensate for changes in the impedance of a dual band antenna element and optimize the antenna in both resonant frequency bands. This is achieved by measuring a parameter (indicative of the impedance of the antenna element) at only a single frequency and then selecting a pair of reactance values which are optimum for both resonant frequency bands.

Figure 4:
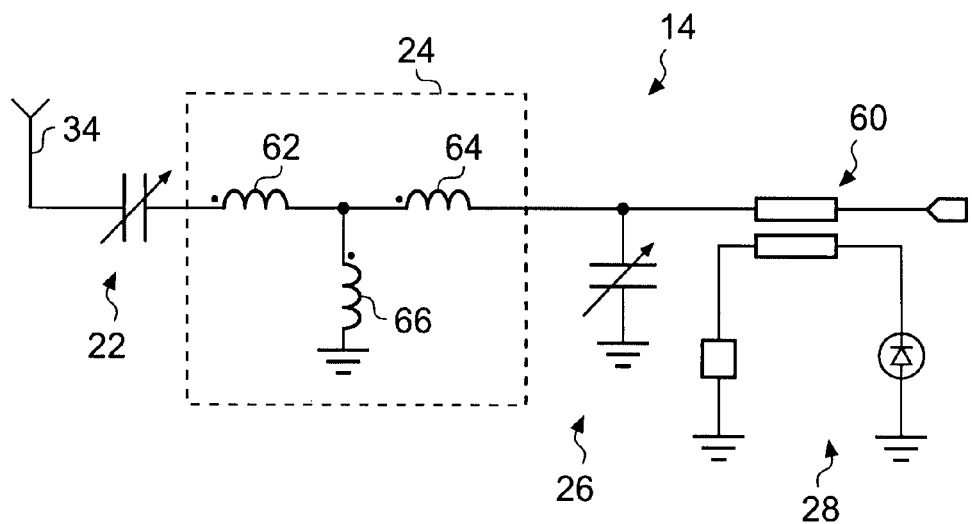
FIG. 4 illustrates a schematic diagram of an apparatus according to another embodiment of the invention.

FIG. 4 illustrates a schematic diagram of one embodiment of an apparatus according to the present invention. In this embodiment, the first variable reactance component is a variable series capacitor 22 and the second variable reactance component is a variable shunt capacitor 26. The detector 28 includes a coupler 60 and is configured to detect the VSWR of the apparatus 14. The matching circuit 24 is a T type matching circuit and includes a series inductor 62 connected to the variable serial capacitor 22, a series inductor 64 connected to the variable shunt capacitor 26 and a shunt inductor 66 connected to the series inductor 62 and to the series inductor 64.

Figure 5:
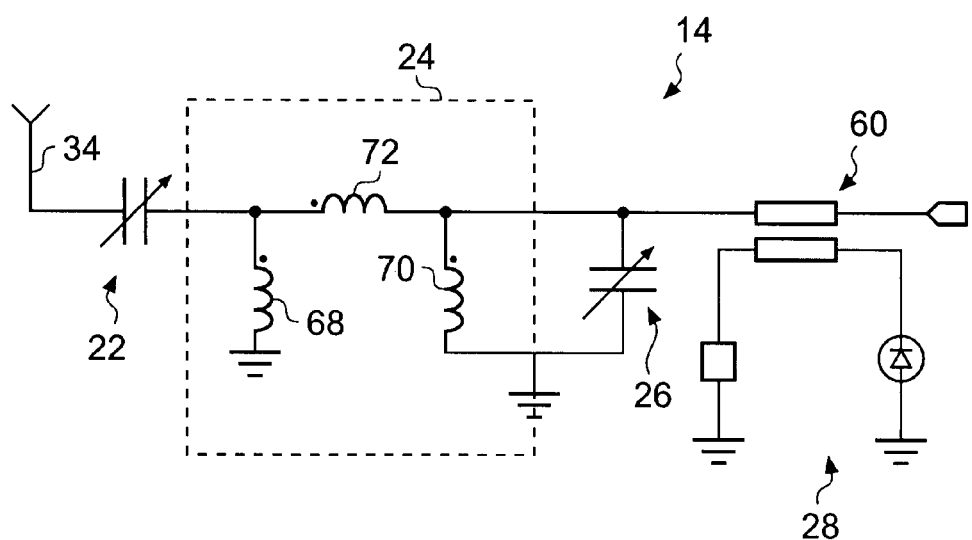
FIG. 5 illustrates a schematic diagram of an apparatus according to a further embodiment of the invention.

FIG. 5 illustrates a schematic diagram of another embodiment of an apparatus according to the present invention. This embodiment is similar to the embodiment illustrated in FIG. 4 and where the features are similar, the same reference numerals are used. In this embodiment, the matching circuit 24 is a Pi type matching circuit and includes a shunt inductor 68 connected to the variable series capacitor 22, a shunt inductor 70 connected, in parallel, with the variable shunt capacitor 26 and a series inductor 72 connected to the shunt inductor 68 and to the shunt inductor 70.

At steps 56 and 58 in the embodiments illustrated in FIGS. 4 and 5, if the second frequency band is greater than the first frequency band, it is desirable to use a capacitor ratio (variable shunt capacitor 26: variable series capacitor 22) which provides a higher operational frequency band (so that the desired second frequency band is encompassed within that frequency band). Consequently, the controller 30 selects the numerically higher ratio because the higher ratio has the effect of electrically shortening the antenna element (when compared to the numerically lower ratio) and thereby increases the frequencies of the operational frequency band.

If the second frequency band is less than the first frequency band, it is desirable to use a capacitor ratio (variable shunt capacitor 26: variable series capacitor 22) which provides a lower operational frequency band (so that the desired second frequency band is encompassed within that frequency band). Consequently, the controller 30 selects the numerically lower ratio because the lower ratio has the effect of electrically lengthening the antenna element (when compared to the numerically higher ratio) and thereby decreases the frequencies of the operational frequency band.

Figure 6:
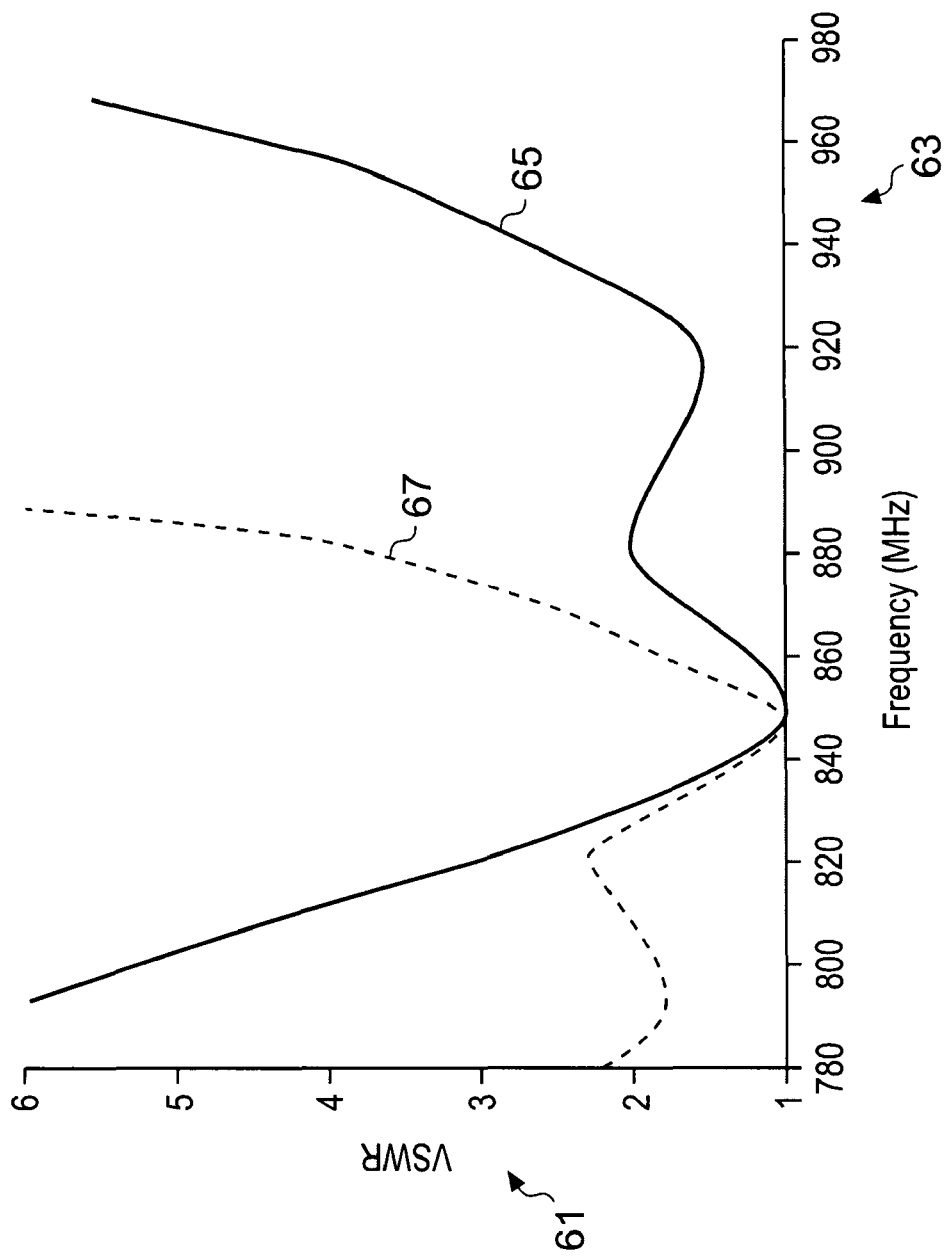
FIG. 6 illustrates a graph of voltage standing wave ratio (VSWR) versus frequency for the antenna element and apparatus illustrated in FIG. 4.

FIG. 6 illustrates a graph of voltage standing wave ratio (VSWR) versus frequency for the embodiment illustrated in FIG. 4. The graph includes a vertical Y axis 61 for the voltage standing wave ratio and an X axis 63, orthogonal to the Y axis 61, for the frequency of the antenna element 34.

The VSWR for a plurality of frequencies is plotted for the two optimum ratios of shunt capacitor 26 value to series capacitor 22 value. In this embodiment, the VSWR was measured at the transmission frequency of approximately 850 MHz. The series inductor 62 has an inductance of 8 nH, the series inductor 64 has an inductance of 0.6 nH and the shunt inductor 66 has an inductance of 0.4 nH.

For the first optimum ratio, the series capacitor 22 has a capacitance of 24 pF and the shunt capacitor has a capacitance of 32.5 pF. Consequently, the first optimum ratio has a value of 1.35 and its plot of VSWR versus frequency is represented by the solid line 65. The solid line 65 has a first minima at approximately 850 MHz and a second minima at approximately 915 MHz.

For the second optimum ratio, the series capacitor 22 has a capacitance of 100 pF and the shunt capacitor 26 has a capacitance of 38.5 pF. Consequently, the second optimum ratio has a value of 0.39 and its plot of VSWR versus frequency is represented by the dotted line 67. The dotted line 67 has a first minima at approximately 790 MHz and a second minima at approximately 850 MHz.

In this embodiment, if the desired second frequency band is greater than the first frequency band (850 MHz in this example) the controller 30 selects the first optimum ratio (the numerically highest ratio) because it has a minima at a frequency (915 MHz in this example) greater than the first frequency band and thereby covers the desired second frequency band. If the desired second frequency band is less than the first frequency band the controller 30 selects the second optimum ratio (the numerically lowest ratio) because it has a minima at a frequency (790 MHz in this example) which is less than the first frequency band and thereby covers the desired second frequency band.

Figure 7:
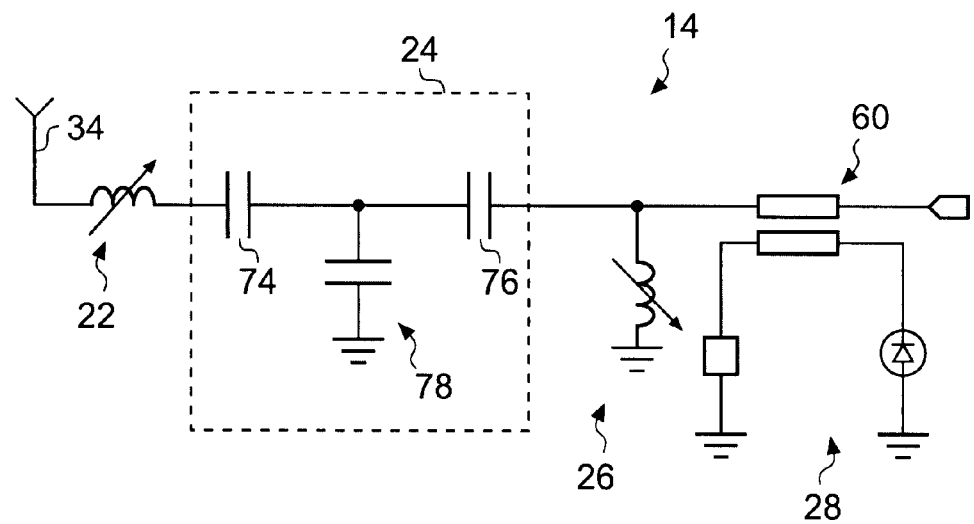
FIG. 7 illustrates a schematic diagram of an apparatus according to another embodiment of the invention.

FIG. 7 illustrates a schematic diagram of a further embodiment of an apparatus according to the present invention. In this embodiment, the first variable reactance component is a variable series inductor 22 and the second variable reactance component is a variable shunt inductor 26. The detector 28 includes a coupler 60 and is configured to detect the VSWR of the apparatus 14. The matching circuit 24 is a T type matching circuit and includes a series capacitor 74 connected to the variable series inductor 22, a series capacitor 76 connected to the variable shunt inductor 26 and a shunt capacitor 78 connected to the variable series inductor 22 and to the series capacitor 76.

Figure 8:
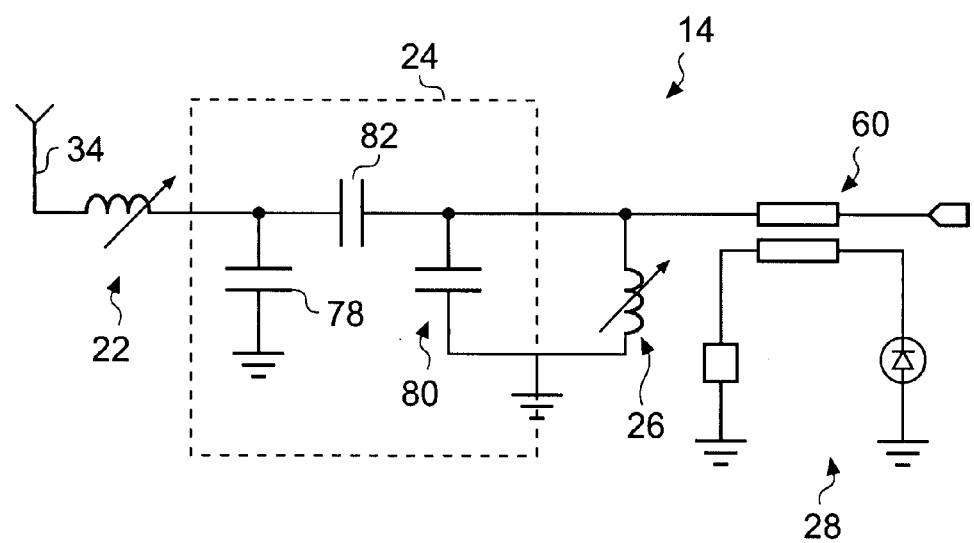
FIG. 8 illustrates a schematic diagram of an apparatus according to a further embodiment of the invention.

FIG. 8 illustrates a schematic diagram of another embodiment of an apparatus according to the present invention. This embodiment is similar to the embodiment illustrated in FIG. 6 and where the features are similar, the same reference numerals are used. In this embodiment, the matching circuit 24 is a Pi type matching circuit and includes a shunt capacitor 78 connected to the variable series inductor 22, a shunt capacitor 80 connected, in parallel, with the variable shunt inductor 26 and a series capacitor 82 connected to the shunt capacitor 78 and to the shunt capacitor 80.

At steps 56 and 58 in the embodiments illustrated in FIGS. 7 and 8, if the second frequency band is greater than the first frequency band, it is desirable to use an inductor ratio (variable shunt inductor 26: variable series inductor 22) which provides a higher operational frequency band (so that the desired second frequency band is encompassed within that frequency band). Consequently, the controller 30 selects the numerically lower ratio because the lower ratio has the effect of electrically shortening the antenna element (when compared to the numerically higher ratio) and thereby increases the frequencies of the operational frequency band.

If the second frequency band is less than the first frequency band, it is desirable to use an inductor ratio (variable shunt inductor 26: variable series inductor 22) which provides a lower operational frequency band (so that the desired second frequency band is encompassed within that frequency band). Consequently, the controller 30 selects the numerically higher ratio because the higher ratio has the effect of electrically lengthening the antenna element (when compared to the numerically lower ratio) and thereby decreases the frequencies of the operational frequency band.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   a matching circuit;
   a first variable reactance component, having a first range of reactance values, and connected to the matching circuit and connectable to an antenna element operable in a first frequency band and a second frequency band;
   a second variable reactance component, having a second range of reactance values, and connected to the matching circuit;
   a detector for detecting a parameter, indicative of an impedance of the apparatus, over at least a part of the first range and second range of reactance values; and
   a controller configured to determine, using information provided by the detector, optimum ratios of the second reactance values to the first reactance values, at a frequency in the first frequency band, and configured to select a first optimum ratio when the second frequency band is greater than the first frequency band and configured to select a second different optimum ratio when the second frequency band is less than the first frequency band.

2. An apparatus as claimed in claim 1, wherein the controller is configured to determine if the second frequency band is higher or lower than the first frequency band.

3. An apparatus as claimed in claim 1, wherein the detector is configured to detect the parameter over at least a part of the first range and second range of reactance values at the frequency in the first frequency band.

4. An apparatus as claimed in claim 1, wherein the controller is configured to change the reactance value of the first variable reactance component while keeping the reactance value of the second variable reactance component constant, and the detector is arranged to detect the parameter after each change in reactance value of the first variable reactance component.

5. An apparatus as claimed in claim 4, wherein when the first variable reactance component has changed reactance value a predetermined number of times, the controller is configured to change the reactance value of the second variable reactance component and the detector is arranged to detect the parameter after the change in reactance value of the second variable reactance component.

6. An apparatus as claimed in claim 1, wherein the parameter of the apparatus is a voltage standing wave ratio (VSWR) of the apparatus.

7. An apparatus as claimed in claim 1, wherein the detector includes a coupler and is connected to the second variable reactance component.

8. An apparatus as claimed in claim 1, wherein the first variable reactance component is a series capacitor and the second variable reactance component is a shunt capacitor.

9. An apparatus as claimed in claim 8, wherein the controller is configured to determine two optimum ratios, the first optimum ratio and the second different optimum ratio, and is configured to select a numerically higher optimum ratio when the second frequency band is greater than the first frequency band, and is configured to select the a numerically lower optimum ratio when the second frequency band is less than the first frequency band.

10. A device comprising the apparatus as claimed in claim 1.

11. A module comprising the apparatus as claimed in claim 1.

12. A method comprising:
   detecting a parameter, indicative of an impedance of an apparatus, over at least a part of a first range of reactance values of a first variable reactance component, connected to a matching circuit and connectable to an antenna element operable in a first frequency band and a second frequency band, and over at least a part of a second range of reactance values of a second variable reactance component, connected to the matching circuit;
   determining, using information provided by the detection, optimum ratios of the second reactance values to the first reactance values, at a frequency in the first frequency band;
   selecting a first optimum ratio when the second frequency band is greater than the first frequency band; and
   selecting a second different optimum ratio when the second frequency band is less than the first frequency band.

13. A method as claimed in claim 12, comprising determining if the second frequency band is higher or lower than the first frequency band.

14. A method as claimed in claim 1, wherein the detection is performed at the frequency in the first frequency band.

15. A method as claimed in claim 12, comprising changing the reactance value of the first variable reactance component while keeping the reactance value of the second variable reactance component constant, and detecting the parameter after each change in reactance value of the first variable reactance component.

16. A method as claimed in claim 15, further comprising changing the reactance value of the second variable reactance component when the first variable reactance component has changed reactance value a predetermined number of times and detecting the parameter after the change in reactance value of the second variable reactance component.

17. A method as claimed in claim 12, wherein the parameter of the apparatus is a voltage standing wave ratio (VSWR) of the apparatus.

18. A method as claimed in claim 12, wherein the first variable reactance component is a series capacitor and the second variable reactance component is a shunt capacitor.

19. A method as claimed in claim 18, wherein the determination determines two optimum ratios, the first optimum ratio and the second different optimum ratio, and the method comprises selecting a numerically higher optimum ratio when the second frequency band is greater than the first frequency band, and selecting a numerically lower optimum ratio when the second frequency band is less than the first frequency band.

20. A computer program embodied on a computer readable medium, the computer program comprising program instructions for use with a controller of an apparatus, the program code configured to cause the controller to perform:

receiving a detected parameter from a detector in the apparatus, the apparatus comprising the controller, the detector, a first variable reactance component connected to a matching circuit and connectable to an antenna element operable in a first frequency band and a second frequency band, and comprising a second variable reactance component connected to the matching circuit, the parameter indicative of an impedance of the apparatus, over at least a part of a first range of reactance values of the first variable reactance component, and over at least a part of a second range of reactance values of the second variable reactance component, connected to the matching circuit;

determining, using information provided by the detection, optimum ratios of the second reactance values to the first reactance values, at a frequency in the first frequency band;

selecting a first optimum ratio when the second frequency band is greater than the first frequency band;

selecting a second different optimum ratio when the second frequency band is less than the first frequency band; and controlling the first variable reactance component and the second variable reactance component using the selected first or second optimum ratio.

21. A mobile telephone physical entity embodying the computer program as claimed in claim 20.

* * * * *